(12) United States Patent
Lichtensteiger et al.

(10) Patent No.: US 7,821,294 B2
(45) Date of Patent: Oct. 26, 2010

(54) INTEGRATED CIRCUIT CONTAINING MULTI-STATE RESTORE CIRCUITRY FOR RESTORING STATE TO A POWER-MANAGED FUNCTIONAL BLOCK

(75) Inventors: Susan K. Lichtensteiger, Essex Junction, VT (US); Michael R. Ouellette, Westford, VT (US); Raymond W. M. Schuppe, South Burlington, VT (US); Sebastian T. Ventrone, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 12/135,249

(22) Filed: Jun. 9, 2008

(65) Prior Publication Data
US 2009/0302889 A1 Dec. 10, 2009

(51) Int. Cl.
H03K 19/173 (2006.01)
(52) U.S. Cl. ...................................... 326/38
(58) Field of Classification Search ............. 326/37–41, 326/47, 101
See application file for complete search history.

(56) References Cited

U.S. PATENT DOCUMENTS

| | | | |
|---|---|---|---|
| 4,937,770 A | 6/1990 | Samuels et al. | |
| 5,995,420 A * | 11/1999 | Hesley | 365/189.07 |
| 6,553,556 B1 | 4/2003 | Blodgett | |
| 6,781,437 B2 | 8/2004 | Ma | |
| 2003/0036893 A1 | 2/2003 | Chen | |
| 2003/0046053 A1 | 3/2003 | Wheeler et al. | |
| 2003/0131336 A1 | 7/2003 | Blodgett | |
| 2004/0215435 A1 | 10/2004 | Hunt et al. | |

FOREIGN PATENT DOCUMENTS

JP 5314204 11/1993

* cited by examiner

Primary Examiner—Rexford N Barnie
Assistant Examiner—Thienvu V Tran
(74) Attorney, Agent, or Firm—Downs Rachlin Martin PLLC

(57) ABSTRACT

Multi-state restore circuitry that allows storage elements of a power-managed functional block to be loaded when the functional block is repowered up so that the functional block is ready for operation virtually immediately after voltage ramp-up of the functional block. The multi-state restore circuitry includes a restore-state detector for determining which one of a plurality of restore states of the functional block is applicable to a particular repowering-up of the functional block. The multi-state restore circuitry also includes restore logic that loads the storage elements as a function of the restore state determined by the restore-state detector.

13 Claims, 4 Drawing Sheets

INTEGRATED CIRCUIT CONTAINING MULTI-STATE RESTORE CIRCUITRY FOR RESTORING STATE TO A POWER-MANAGED FUNCTIONAL BLOCK

RELATED APPLICATION DATA

The present application is related to co-pending U.S. application Ser. No. 12/135,250 filed Jun. 9, 2008 entitled Reset Circuitry for Memory Structure Having Multiple Reset States; which is incorporated herein by reference.

FIELD OF THE INVENTION

The present invention generally relates to the field of integrated circuits. In particular, the present invention is directed to an integrated circuit containing multi-state restore circuitry for restoring state to a power-managed functional block.

BACKGROUND OF THE INVENTION

Power consumption of electronic devices that include integrated circuitry is increasingly becoming an important issue for any one or more of a number of reasons. For example, as the operating speeds of integrated circuits (ICs) continually increase, in general so, too, do the power requirements for these circuits, since power consumption varies in direct relation to the operating speed. In addition, as each new generation of technology brings a decrease in feature size and an increase in integration scale, power consumption of ICs generally increases due to the sheer presence of many more circuit elements, e.g., transistors and the like. Furthermore, with the increasing integration scale, electronic devices are capable of supporting more and more features. Power consumption typically increases with greater numbers of features, particularly when a feature requires circuitry that would not be needed in the absence of that feature. Moreover, with decreasing feature sizes comes an increasing amount of leakage current. For example, while fabrication technologies of only a short time ago resulted in leakage current on the order of only a few percent of total power, current fabrication technologies yield current leakage rates of 30% to 40% or more.

There are a number of methods for reducing power consumption of ICs. One method is to simply reduce the systemic operating voltage of the IC. While this method has the ability to significantly reduce the power consumption of ICs (e.g., reducing the operating voltage from 5V to 3.3V results in a gross power reduction of about 56%), there are practical limits to this method. Another method of reducing power consumption of ICs is to reduce the amount of logic circuitry. There are clearly practical limits to this method as well. Consequently, one, the other or both of these methods are typically used in connection with one or more power management methods that seek to reduce the power provided to portions, or "functional blocks," of ICs during periods when these blocks are not needed.

One known power-management technique is to strategically place functional blocks onto voltage islands that can be separately powered up only when needed and down when needed. A challenge with this approach, especially when the functional blocks are relatively large and include many latches, is ensuring that the latches in a power-down functional block are in the state necessary when that functional block is powered back up. One way of handling this is to use a scan-chain method in which the states of all of the latches in a functional block to be powered down are scanned out to an off-voltage-island memory just prior to powering down. When the functional block is powered up again, the stored states are then scanned back into the latches just prior to use. A shortcoming of this approach is that there is a large overhead in the many clock cycles used up in the scanning-in and -out of the states. The greater the number of latches needed to be restored, the larger the overhead. Another way to handle the startup-state issue is to use state-saving latches for all of the latches having states that need to be restored when the functional block is re-powered-up. A drawback of this approach is that state-saving latches are much more complex than non-state-saving latches and, therefore, require much more chip real estate than non-state-saving latches.

SUMMARY OF THE INVENTION

In one implementation, the present disclosure is directed to an integrated circuit. The integrated circuit includes a separately repowerable functional block that includes a restorable storage element and has a plurality of restore states restorable upon repowering-up the separately repowerable functional block; a restore state detector for identifying which one of the plurality of restore states is applicable to a particular repowering up and generating a state signal as a function of the one of the plurality of restore states identified by the restore state identifier; and a restore logic tree connected between the restore state detector and the restorable storage element, the restore logic configured to load, in response to the state signal, the restorable storage elements with a predetermined value corresponding to the one of the plurality of restore states identified by the restore state detector.

In another implementation, the present disclosure is directed to an integrated circuit. The integrated circuit includes a plurality of always-on functional blocks; a plurality of separately repowerable functional blocks each powered by a corresponding respective voltage island; and a power management block functionally connected to ones of the plurality of separately powerable functional blocks, the power management block configured for powering-up and -down the ones of the plurality of separately powerable functional blocks so as to reduce overall power consumption of integrated circuit; wherein at least one of the separately powerable functional blocks has a plurality of restore states and includes: a plurality of restorable storage elements restorable so as to hold a set of predetermined values, the set of predetermined values varying among the plurality of restore states; and restore logic in communication with the plurality of restorable storage elements and configured to load the set of predetermined values into ones of the plurality of restorable storage elements in response to a determined state signal upon repowering up of the at least one of the separately powerable functional blocks.

In a further implementation, the present disclosure is directed to a method of repowering a separately powerable functional block including a number N of restorable storage elements and having a plurality of restore states. The method includes upon a repowering up of the separately powerable functional block, determining which restore state of the plurality of restore states is applicable to the repowering up so as to achieve a determined restore state; generating a restore-state signal as a function of the determined restore state; and logically operating on the restore-state signal so as to populate the N restorable storage elements with predetermined values.

BRIEF DESCRIPTION OF THE DRAWINGS

For the purpose of illustrating the invention, the drawings show aspects of one or more embodiments of the invention.

However, it should be understood that the present invention is not limited to the precise arrangements and instrumentalities shown in the drawings, wherein.

DETAILED DESCRIPTION

Figure 1:
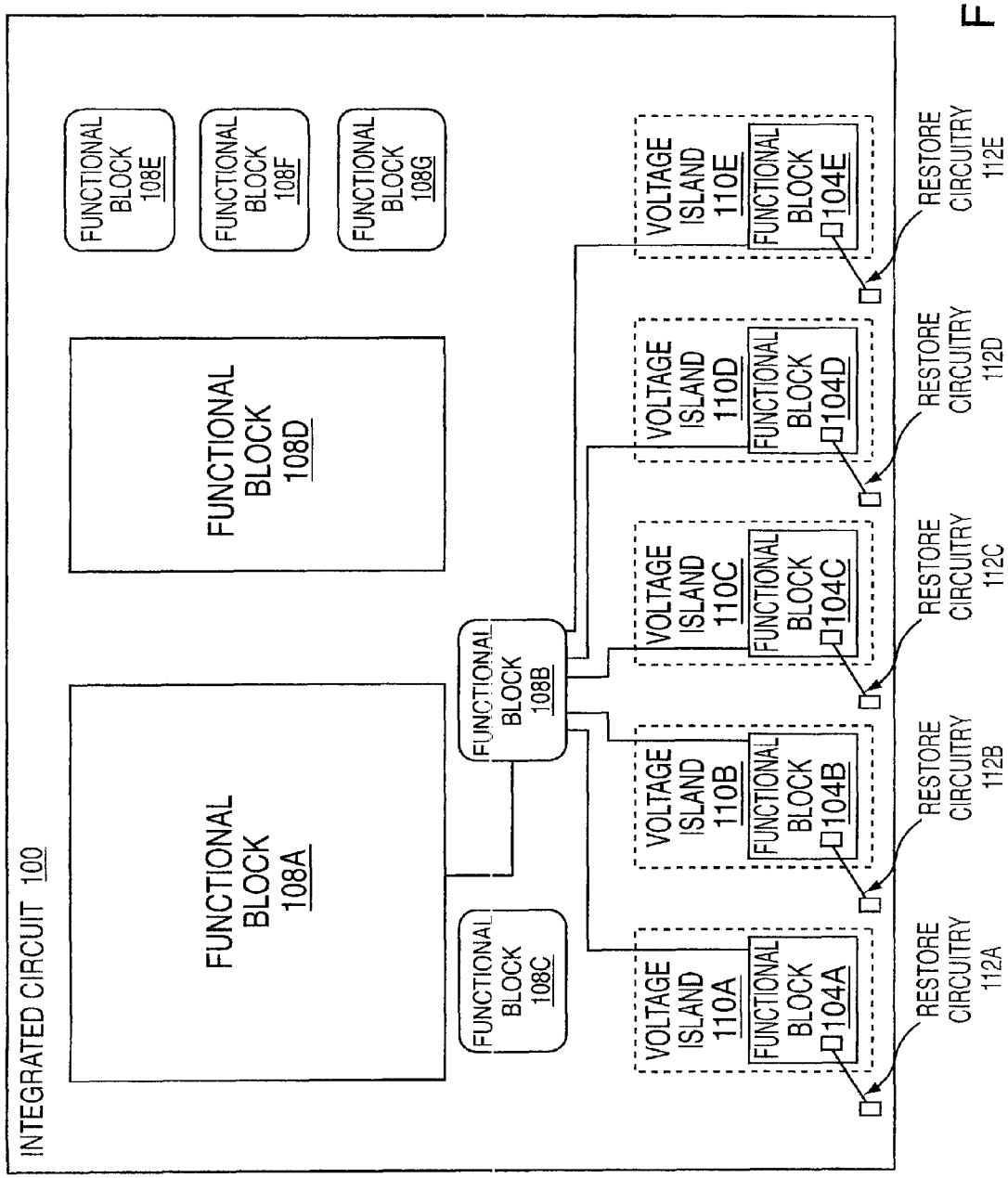
FIG. 1 is a high-level schematic diagram of an integrated circuit of the present invention that includes separately powerable functional blocks having state-restoring circuitry.

Referring now to the drawings, FIG. 1 illustrates at a high level an integrated circuit (IC) 100 that includes a number of functional blocks 104A-E, 108A-G, some of which are able to be powered down and up based on the needs of the overall IC. In this example, functional blocks 104A-E are of a "separately powerable" type and functional blocks 108A-G are of an "always-on" type. In the context of this disclosure, "separately powerable" means that when IC 100 is functioning, separately powerable functional blocks 104A-E are able to be powered up and down individually according to the needs of the IC, while always-on functional blocks 108A-G remain powered continuously as long as the IC is powered. As those skilled in the art will readily appreciate, the type and character of functional blocks 104A-E, 108A-G will vary depending on the purpose of overall integrated circuit 100. Examples of always-on functional blocks that may be functional blocks 108A-G include central processing core (108A), power management block (108B), interrupt controller, and clock management unit. Examples of separately powerable functional blocks that may be functional block 104A-E include floating point units, multiplier units, bus controllers and memory controllers, among others. Of course, those skilled in the art will readily appreciate that these examples are by no means limiting because of the flexibility a designer has in laying out circuitry.

In this example, power management block 108B has the function of controlling the powered-up and -down states of separately powerable functional blocks 104A-E as a function of the needs of overall IC 100. General power management techniques that may be implemented by power management block 108B are disclosed in U.S. Pat. No. 6,720,673 titled "Voltage Island Fencing" and U.S. Pat. No. 7,275,164 titled "System And Method For Fencing Any One Of A Plurality Of Voltage Islands Using A Lookup Table Including AC And DC Components For Each Functional Block Of The Voltage Islands," each of which is incorporated herein by reference in relevant part. Generally, these techniques utilize the concept of placing each of separately powerable functional blocks 104A-E on a corresponding voltage island 110A-E, the power to which is regulated by power management block 108B.

As described below in more detail, each of separately powerable functional blocks 104A-E in this example is unique in that it includes restore circuitry 112A-E that restores the states of ones of the latches (not shown) (or, more generically, storage elements) located within that functional block upon powering up after a power-saving powering down of that block. Each restore circuitry 112A-E provides a low-overhead, power-efficient means for restoring state to the corresponding functional block 104A-E so that it is ready for operation virtually immediately upon re-powering of that functional block. Details of exemplary restore circuitry that could be used for any one of restore circuitries 112A-E are presented below.

Figure 2A:
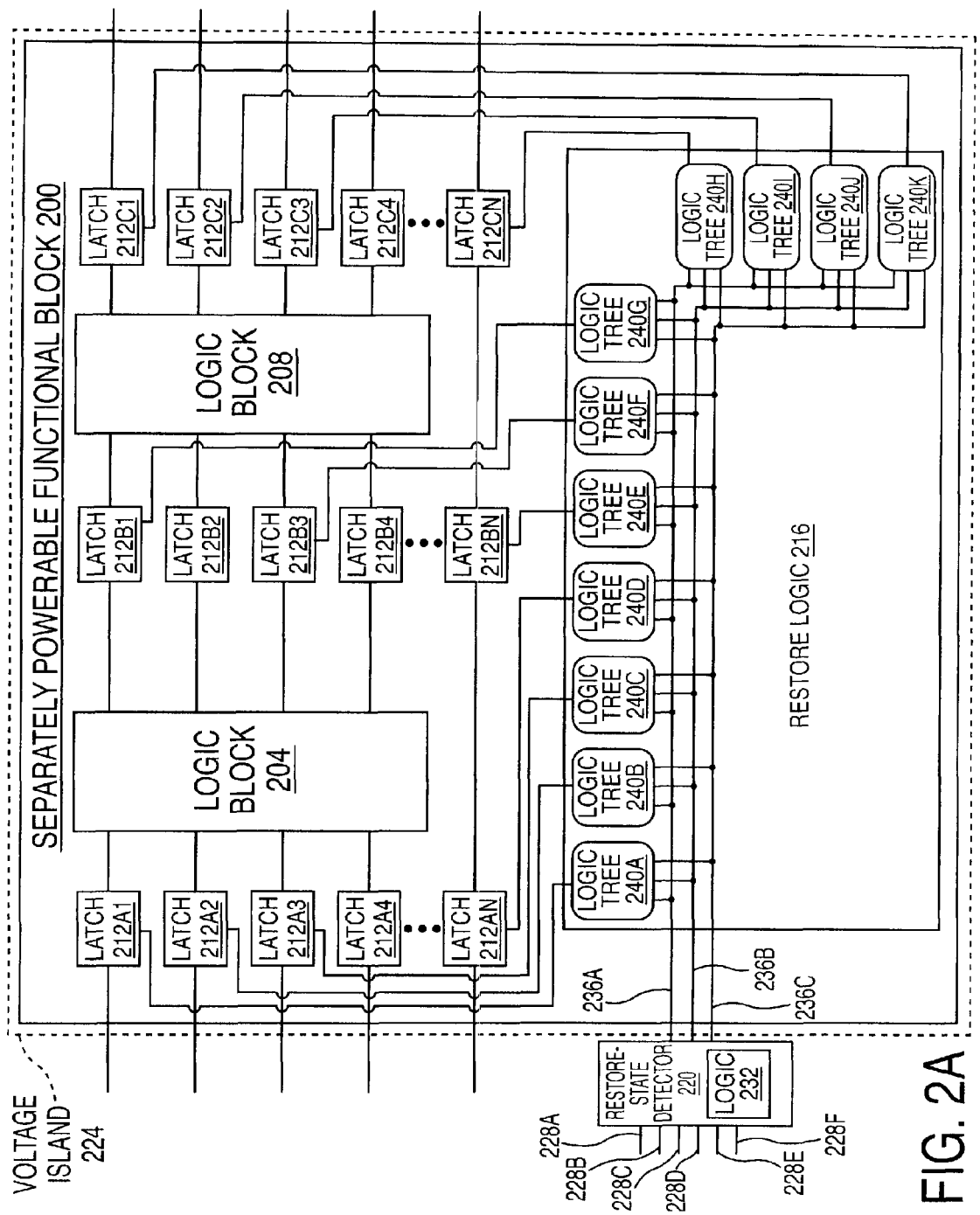
FIG. 2A is a high-level schematic diagram of a separately powerable functional block, which could be used for any one of functional blocks of FIG. 1, showing exemplary state-restoring circuitry.

FIG. 2A illustrates a separately powerable functional block 200 that is generalized such that it could be any one or more of separately powerable functional blocks 104A-E in the example IC 100 of FIG. 1. At a high level, in this example functional block 200 can be considered to include circuitry blocks, here logic blocks 204, 208, and a plurality each of: 1) input storage elements, here, latches 212A1-N; 2) intermediate storage elements, here, latches 212B1-N; and 3) output storage elements, here, latches 212C1-N. Input latches 212A1-N receive data and/or control bits from outside of functional block 200. In the context of IC 100 of FIG. 1, the data and/or control bits that input latches 212A1-N would receive could be from any one of the other functional blocks 104A-E, 108A-G, or other region of IC 100, or even from one or more other source outside of IC 100. Those skilled in the art will readily appreciate the variety of locations where data and/or control bits entering input latches 212A1-N can originate, such that further details need not be provided herein for those skilled in the art to appreciate the broad scope of the present invention. In this example, intermediate latches 212B1-N hold data and/or control bits output from logic block 204 for input to logic block 208. While intermediate latches 212B1-N may not be present in many functional block designs, they are provided in this example to demonstrate that restorable storage elements may be located virtually anywhere within a given functional block. Output latches 212C1-N hold data and/or control bits that are to be output from functional block 200.

As described below, in this example each input, intermediate, and output latch 212A1-N, 212B1-N, 212C-1-N is one of three types, i.e., "restorable," "state-saving," and "don't-care." In the present context, "don't-care" simply means that the storage element is neither restorable nor state-saving. That is, on a re-powering up, the don't-care storage elements will not have either a restored state or saved state, but rather will generally have an unknown state. However, based on the restore-state of logic blocks 204, 208 the state of the don't-care storage elements does not affect the outcome of the operation of the logic blocks. It can be beneficial to identify as many don't-care storage elements as possible, since they typically require the least amount of chip real estate to implement. In this example, only intermediate latch 212B2 is a don't-care latch and is implemented as a conventional non-state-saving latch.

State-saving ones of latches 212A1-N, 212B1-N, 212C1-N in this example are input latch 212A4, intermediate latch 212B4, and output latch 212C4. Oftentimes, though not exclusively, the state-saving storage elements are storage elements that hold data values. Since data values are inherently not a function of any state of the IC in which the data values reside they cannot be restored based on any logic that is based on the state of the IC at the time the functional block at issue, here functional block 200, is powered down. Therefore, data latches are typical candidates for implementation as conventional state-saving storage elements. In this example, each of latches 212A4, 212B4, 212C4 is a conventional state-saving latch. Those skilled in the art understand how to implement state-saving latches and other types of storage elements, such that a detailed explanation is not necessary herein for those skilled in the art to implement the present invention.

In this example, the remaining ones of input latches 212A1-N, intermediate latches 212B1-N, and output latches 212C1-N that are neither don't-care nor state-saving latches are restorable latches. Restorable latches, or more generally, storage elements, are storage elements that can have their state restored upon re-powering up of the functional block that contains the restorable storage elements, here, functional block 200. The restorable ones of the latches explicitly shown in FIG. 2A are latches 212A1-3, 212AN, 212B1, 212B3, 212BN, 212C1-3, 212CN. For implementing the restorability feature of latches 212A1-3, 212AN, 212B1, 212B3, 212BN, 212C1-3, 212CN, in this example functional block 200 is provided with restore logic 216 that is in communication with a restore-state detector 220 that is located outside of the voltage island 224 that allows functional block 200 to be separately powerable relative to any other functional blocks and other circuitry aboard the IC of which functional block 200 is a part.

As described below in greater detail, restore-state detector 220 is configured to select a restore state from among a plurality of possible restore states as a function of a plurality of input signals, here signals 228A-F. For example, an analysis of contents of all of the storage elements at issue, here input, intermediate, and output latches 212A1-N, 212B1-N, 212C1-N, for all possible operating states of the overall IC of which functional block 200 is part, relative to the powering up and down of functional block 200, may reveal that there are seven distinct restore states in which at least some of restorable latches 212A1-3, 212AN, 212B1, 212B3, 212BN, 212C1-3, 212CN must be restored to differing values. Input signal 228A-F will be those signals that are necessary for selecting among the possible restore state. Examples of such signals include, signals that indicate the operating state of other functional blocks, signals that indicate the mode(s) that the overall IC is in, and signals that indicate the function to be performed by functional block 200 upon re-powering up, among others. The selection of the proper state may be performed by selection logic 232 located within restore-state detector 220.

Figure 2B:
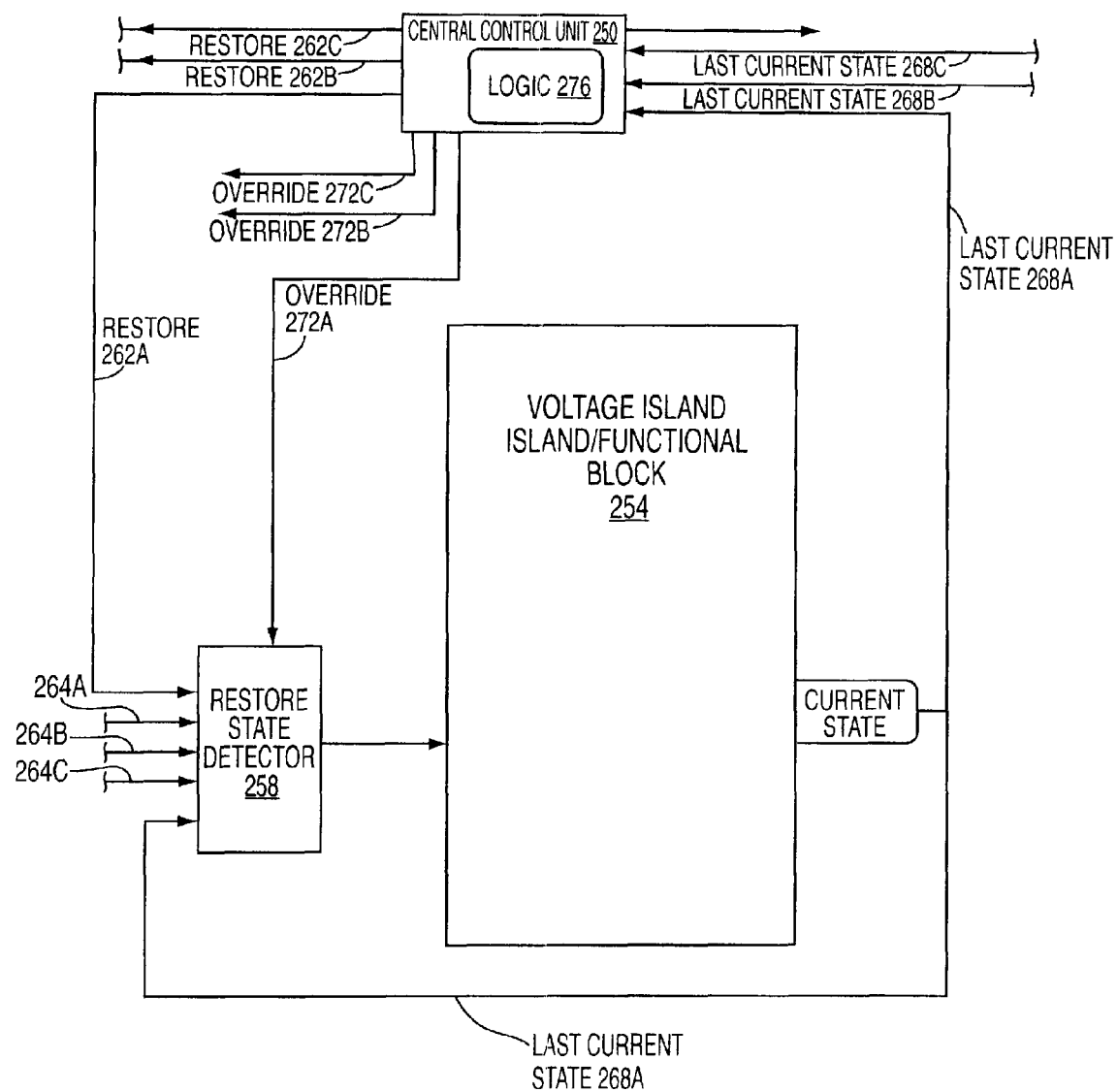
FIG. 2B is a high-level schematic diagram of a separately powerable functional block, which could be used for any one of functional blocks of FIG. 1, showing additional circuitry that can be used in conjunction with state-restoring circuitry.

To illustrate the sources of some of these signals and their usefulness, FIG. 2B contains an example of state saving circuitry that includes a central control unit 250 that can control the state-saving functionality of, for example, all separately powerable functional blocks aboard an IC chip or locate in a particular region of the chip. In this example, only single separately powerable voltage island/functional block 254 is shown for convenience. Voltage island/functional block 254 may be identical, or similar, to voltage island 224 and functional block 200 of FIG. 2A. Like the state saving circuitry of FIG. 2A, the state-saving circuitry of FIG. 2B includes a restore state detector 258 that is responsive to a plurality of inputs, in the example a restore signal 262A, control signals 264A-C, a last current state signal 268A and an override signal 272A. Restore signal 262A is generated by central control unit 250 and is used to signal restore state detector 258 that a restoration of state is proper for any particular repowering of voltage island/functional block 254. Central control unit 250 may also generate one or more like restore signals, here restore signals 262C-D, for other voltage islands/functional blocks (not shown) aboard the IC chip.

Control signals 264A-C may be signals from other functional blocks that may affect the state to which voltage island/functional block 254 is restored. Depending on the conditions of other signals, restore state detector 258 will use control signals 264A-D to determine the state to which voltage island/functional circuitry should be restored. Last current state signal feeds back to restore state detector 258 the current state of voltage island/functional block 254, as the current state may be useful in determining the state that should be restored to the functional block on the next repowering. Override signal 272A, which is generated by central control unit 250, can be used to override the normal functioning of restore state detector 258 to force a particular restore state or lack thereof, as determined by logic 276 onboard the central control unit. Central control unit 250 can base the generation of override signal 272A, and indeed any other override signals for other functional blocks, here override signals 272B-C, on any suitable input, including last current state signal 268A and last current state signals from other blocks, here last current state signals 268B-C.

Referring again to FIG. 2A, in this example the selected state is output from restore-state detector 220 to restore logic 216 on three state bit lines 236A-C. Since there are seven states, three bit lines 236A-C are used. For example, bit lines 236A-C for states "1," "2," "3," etc. may be, respectively, "100," "010," "110," etc. In this example, restore logic 216 includes a logic cone 240A-K for each one of restorable latches 212A1-3, 212AN, 212B1, 212B3, 212BN, 212C1-3, 212CN. As those skilled in the art will appreciate, each logic cone 240A-K includes a set of logic gates (not shown) selected and arranged to operate on the bit values on state bit lines 236A-C and provide the desired state to the corresponding one of restorable latches 212A1-3, 212AN, 212B1, 212B3, 212BN, 212C1-3, 212CN as a function of the selected state provided by restore-state detector 220.

Figure 3:
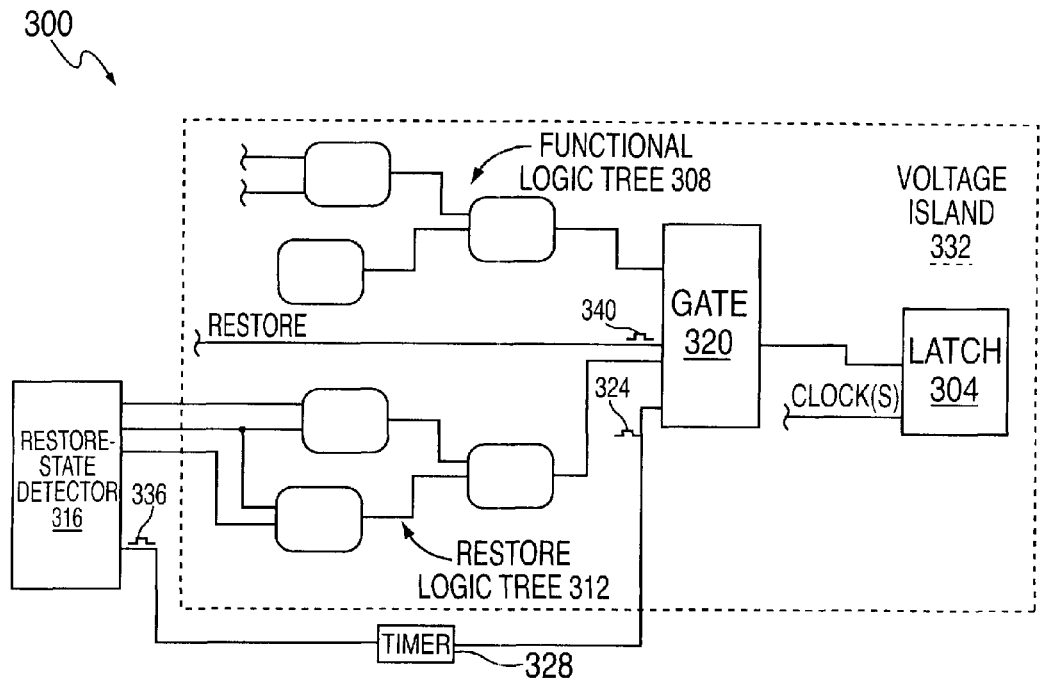
FIG. 3 is a high-level schematic diagram of a portion of state-restoring circuitry, which could be used for state-restoring circuitry of FIG. 2A, illustrating an example of circuitry associated with one of the restorable latches of FIG. 2A.

FIG. 3 illustrates an example of circuitry 300 that can be used to support the functioning of a restorable storage element, here restorable latch 304. Restorable latch 304 and accompanying circuitry 300 could be implemented, for example, for any one or all of restorable latches 212A1-3, 212AN, 212B1, 212B3, 212BN, 212C1-3, 212CN of FIG. 2A. In this example, during normal functioning of the separately powerable logic block (not shown) of which restorable latch 200 is a part, restorable latch 200 periodically latches and stores a bit of information from a functional logic tree 308, which can be a suitable logic tree pertinent to the nature of that bit of information. In the context of FIG. 2A, if restorable latch 304 were one of restorable intermediate latches 212B1, 212B3, 212BN then functional logic tree 308 would be part of logic block 204. On the other hand, if restorable latch 304 were one of restorable output latches 212C1-3, 212CN, then functional logic tree 308 would be part of logic block 208.

However, during a powering-up restore operation, the function of restorable latch 304 is to latch and hold a restored bit provided by restore logic tree 312 as a function of the selected state output by the restore-state detector 316. To accomplish this dual-functionality of restorable latch 304, in this example circuitry 300 is provided with a selection gate 320 that selects between the output of functional logic tree 308 and the output of restore logic tree 312 and a function of a lock signal 324. In this example, lock signal 324 is provided by a timer 328 that holds selection gate 320 in a state in which the output of restore logic tree 312 is selected until a predetermined time after the voltage island 332 has ramped back up from a powered down state. Once timer 328 has timed-out, selection gate 320 reverts to selecting the output of functional logic tree 308 and the latch begins operating in its normal functional mode. Timer 328 may be responsive to a timing signal 336 output by restore-state detector 316 in conjunction with the output of the selected state to restore logic tree 312. On some embodiments, for example, timer 328 can be a set of delay elements (not shown) tuned so that the delay is always greater than the maximum voltage ramp time of voltage island 332. In other embodiments, timer 328 can be a state machine that counts a set number of clock cycles. Then, when the count is equal to or greater than the ramp period of voltage island 332, lock signal 324 would control selection gate 320 so as to degate the restore-state override. Selection gate 320 may also be responsive to a restore signal 340, which may come from power management block 108B (FIG. 1).

Figure 4:
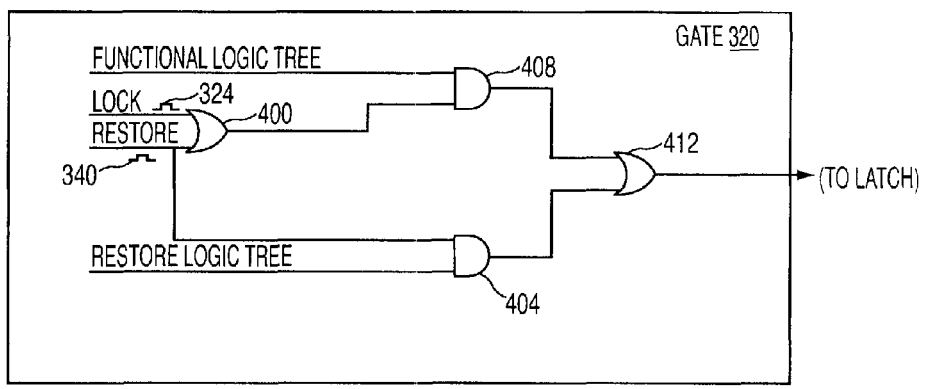
FIG. 4 is a logic diagram of the gate of the circuitry shown in FIG. 3.

Referring to FIGS. 3 and 4, FIG. 4 illustrates an exemplary embodiment of selection gate 320 of FIG. 3. Selection gate 320 includes a first OR-gate 400 that receives lock signal 324 and a restore signal 340. A first AND-gate 404 receives restore signal 340 and the output of restore logic tree 312 (FIG. 3). A second AND-gate 408 receives the output of first OR-gate 400 and the output of functional logic tree 308 (FIG. 3). The outputs of first and second AND-gates 404, 408 are ORed together by a second OR-gate 412 so as to provide the correct output to restorable latch 304 (FIG. 3). Those skilled in the art will appreciate that the logic structures are a function of the unique design state they must be restored to. The combinational logic tree generates a control signal to each latch. This logic an be optimized and reduced.

Related U.S. patent application Ser. No. 12/135,250, which is incorporated herein by reference herein, above, discloses exemplary methods for determining the number of restore states for a particular IC at issue and for configuring the storage elements of repowerable functional blocks among the various types, for example, restorable, state-saving and don't care, so as to achieve an efficient overall design. Those skilled in the art will understand that once the restore states and storage element configurations have been determined, it is largely a matter logic design to design appropriate logic for the various aspects of the state-restoring circuitry of the present disclosure, such as the restore logic trees of FIGS. 2A and 3 and the state selection logic 232 of FIG. 2A. Therefore, and considering the fact that differing overall IC designs will typically have differing requirements for the state restoring circuitry, it is not necessary to provide details of the logic design processes.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An integrated circuit, comprising:
   a separately repowerable functional block that includes a restorable storage element and has a plurality of restore states restorable upon repowering-up said separately repowerable functional block;
   a restore state detector for identifying which one of the plurality of restore states is applicable to a particular repowering up and generating a state signal as a function of the one of the plurality of restore states identified by said restore state detector;
   a restore logic tree connected between said restore state detector and said restorable storage element, said restore logic tree configured to load, in response to the state signal, said restorable storage elements with a predetermined value corresponding to the one of the plurality of restore states identified by said restore state detector;
   a functional logic tree; and
   a selector gate coupled between said functional logic tree and said restorable storage element and between said restore logic tree and said restorable storage element, said selector gate for selecting between said functional logic tree and said restore logic tree.

2. An integrated circuit according to claim 1, wherein said separately repowerable functional block is located on a voltage island having a repowering ramp time and the integrated circuit further comprises a timer for holding said selector gate in a restore state for at least the repowering ramp time.

3. An integrated circuit according to claim 1, wherein said restore state detector is responsive to at least one input signal that originates offboard of said separately repowerable functional block.

4. An integrated circuit according to claim 1, wherein said separately repowerable functional block further includes at least one state-saving storage element in addition to said restorable storage element.

5. An integrated circuit according to claim 4, wherein said separately repowerable functional block still further includes at least one non-state-saving, non-restorable storage element in addition to said state-saving and restorable storage elements.

6. An integrated circuit according to claim 1, wherein said separately repowerable functional block is located on a voltage island, said restore state detector is located off of said voltage island, and said restore logic tree is located on said voltage island.

7. An integrated circuit, comprising:
   a plurality of always-on functional blocks;
   a plurality of separately repowerable functional blocks each powered by a corresponding respective voltage island; and
   a power management block functionally connected to ones of said plurality of separately repowerable functional blocks, said power management block configured for powering-up and -down said ones of said plurality of separately repowerable functional blocks so as to reduce overall power consumption of integrated circuit;
   wherein at least one of said separately repowerable functional blocks has a plurality of restore states and includes:
     a plurality of restorable storage elements restorable so as to hold a set of predetermined values, said set of predetermined values varying among the plurality of restore states; and
     restore logic in communication with said plurality of restorable storage elements and configured to load said set of predetermined values into ones of said plurality of restorable storage elements in response to a determined state signal upon repowering up of said at least one of said separately repowerable functional blocks.

8. An integrated circuit according to claim 7, further comprising a restore state detector configured to generate the determined state signal as a function of at least one input signal that originates offboard of said at least one separately repowerable functional block.

9. An integrated circuit according to claim 8, wherein said at least one separately repowerable functional block is located on a voltage island, said restore state detector is located off of said voltage island, and said restore logic tree is located on said voltage island.

10. An integrated circuit according to claim 7, wherein said at least one separately repowerable functional block further comprises:

functional logic; and a plurality of selector gates coupled respectively between said functional logic said plurality of restorable storage elements and respectively between said restore logic and said plurality of restorable storage elements, said plurality of selector gates for selecting between said functional logic and said restore logic.

11. An integrated circuit according to claim 10, wherein said at least one separately repowerable functional block is located on a voltage island having a repowering ramp time and the integrated circuit further comprises a timer for holding said plurality of selector gates in a restore state for at least the repowering ramp time.

12. An integrated circuit according to claim 7, wherein said at least one separately repowerable functional block further includes a plurality of state-saving storage elements in addition to said plurality of restorable storage elements.

13. An integrated circuit according to claim 12, wherein said at least one separately repowerable functional block still further includes a plurality of non-state-saving, non-restorable storage elements in addition to said pluralities of state-saving and restorable storage elements.

* * * * *